(12) United States Patent
Wasshuber

(10) Patent No.: US 8,581,233 B2
(45) Date of Patent: *Nov. 12, 2013

(54) VARIABLE CAPACITOR SINGLE-ELECTRON TRANSISTOR INCLUDING A P-N JUNCTION GATE ELECTRODE

(75) Inventor: Christoph Wasshuber, Somerville, MA (US)

(73) Assignee: Texas Instruments Incorporated, Dallas, TX (US)

( * ) Notice: Subject to any disclaimer, the term of this patent is extended or adjusted under 35 U.S.C. 154(b) by 980 days.

This patent is subject to a terminal disclaimer.

(21) Appl. No.: 12/575,364

(22) Filed: Oct. 7, 2009

(65) Prior Publication Data
US 2010/0019227 A1    Jan. 28, 2010

Related U.S. Application Data

(60) Division of application No. 11/609,205, filed on Dec. 11, 2006, now Pat. No. 7,619,241, which is a division of application No. 10/960,239, filed on Oct. 7, 2004, now Pat. No. 7,166,858, which is a continuation-in-part of application No. 10/448,673, filed on May 30, 2003, now Pat. No. 6,844,566.

(51) Int. Cl.
    *H01L 29/772*    (2006.01)
(52) U.S. Cl.
    USPC ........... 257/24; 257/25; 257/27; 257/E29.168
(58) Field of Classification Search
    USPC ............. 257/9, 14, 23–25, 27, 30, 31, 38, 39, 257/499, E29.168
    See application file for complete search history.

(56) References Cited

U.S. PATENT DOCUMENTS

| 5,963,471 A | 10/1999 | Ohata et al. |
| 6,444,546 B1 | 9/2002 | Lee et al. |
| 6,844,566 B2 | 1/2005 | Wasshuber |
| 7,166,858 B2 * | 1/2007 | Wasshuber ................. 257/39 |
| 2003/0209739 A1 | 11/2003 | Hisamoto et al. |

FOREIGN PATENT DOCUMENTS

EP    0696065    2/1996

OTHER PUBLICATIONS

"A Multiple-Valued Logic With Merged Single-Electron and MOS Transistors," Electron Devices Meeting, 2001. IEDM Technical Digest. International, Dec. 2-5, 2001, pp. 7.2.1-7.2.4 (H. Inokawa,.A. Fujiwara and Y. Takahashi) pp.

(Continued)

*Primary Examiner* — Marcos D. Pizarro
(74) *Attorney, Agent, or Firm* — Alan A. R. Cooper; W. James Brady, III; Frederick J. Telecky, Jr.

(57) ABSTRACT

The present invention provides a single-electron transistor device 100. The device comprises a source 105 and drain 110 located over a substrate 115 and a quantum island 120 situated between the source and drain, to form tunnel junctions 125, 130 between the source and drain. The device further includes a fixed-gate electrode 135 located adjacent the quantum island 120. The fixed-gate electrode has a capacitance associated therewith that varies as a function of an applied voltage to the fixed-gate electrode. The present invention also includes a method of fabricating a single-electron device 300, and a transistor circuit 800 that include a single-electron device 810.

6 Claims, 5 Drawing Sheets

(56) References Cited

OTHER PUBLICATIONS

"Silicon Single-Electron Transistors With Sidewall Depletion Gates and Their Application to Dynamic Single-Electron Transistor Logic," IEEE Transactions on Electron Devices, vol. 49, Issue 4, Apr. 2002, pp. 627-635 (Dae Hwan Kim; Suk-Kang Sung; Kyung Rok Kim; Jong Duk Lee; Byung-Gook Park; Bum Ho Choi; Sung Woo Hwang; and Doyeol Ahn).

"Measurements of Single Electron Transistor Devices Combined With a CCC: Progress Report," IEEE Transactions on Instrumentation and Measurement, vol. 50, Issue 2, Apr. 2001 pp. 231-234 (Yannick De Wilde, Frederic Gay, Francois Piquemal, and Gerard Geneves).

* cited by examiner

VARIABLE CAPACITOR SINGLE-ELECTRON TRANSISTOR INCLUDING A P-N JUNCTION GATE ELECTRODE

CROSS-REFERENCE TO RELATED APPLICATIONS

This application is a divisional of U.S. patent application Ser. No. 11/609,205, filed Dec. 11, 2006, which is a divisional of U.S. patent application Ser. No. 10/960,239, filed Oct. 7, 2004 (now U.S. Pat. No. 7,166,858), which is a continuation-in-part of U.S. patent application Ser. No. 10/448,673, filed on May 30, 2003 (now U.S. Pat. No. 6,844,566), which is hereby incorporated by reference for all purposes.

TECHNICAL FIELD

The present invention is directed in general to the manufacture of semiconductor devices, and, more specifically, to a single electron device and method of fabrication thereof.

BACKGROUND

The continuing demand for increasing computational power and memory space is driving the miniaturization of integrated circuits. To sustain progress, miniaturization will soon be driven into the nanometer regime. Unfortunately, conventional devices cannot be scaled down straightforwardly, because of problems caused by parasitic resistances, scattering and tunneling.

Single-electronics offer solutions to some of the problems arising from miniaturization. Single-electronic devices can be made from readily available materials and can use as little as one electron to define a logic state. Unlike conventional devices, single-electron devices show improved characteristics when their feature size is reduced. This follows from the fact that single-electron devices are based on quantum mechanical effects that are more pronounced at smaller dimensions. Single-electron devices also have low power consumption and therefore there are less energy restrictions to exploit the high integration densities that are possible with such devices.

The practical implementation of single-electronic devices capable of reproducibly defining a logic state remains problematic, however. For instance, it is desirable to develop process technology conducive to the mass production of nanometer scale single-electron devices structures and for such devices to operate at room temperature. Much more important than mass production and room temperature operation, however, is the sensitivity of single-electron devices towards random background charge effects.

A random background charge can alter the Coulomb blockade energy, thereby altering the operating characteristics of the device. For instance, a trapped or moving charge in proximity to a single-electron transistor (SET) logic gate could flip the device's logic state, thereby making the output from the device unreliable at any temperature. In addition, background charge movement can cause the device's characteristics to shift over time.

Previous attempts to reduce the random background charge dependence of single-electronic devices have not been entirely successful. Efforts to find impurity-free fabrication techniques have not lead to devices that are sufficiently free of random background charge. Adding redundancy into the logic circuit is considered to be ineffective, especially in the presence of high background charge noise levels. An operating-point-refresh to adjust the bias conditions of the device is also not considered to be an efficient solution. Accordingly, single-electronic logic devices have heretofore been considered to be impractical due to their sensitivity to random background charge effects, and the consequent instability of the device's logic state.

Accordingly, what is needed in the art is a single-electron device and method of manufacturing thereof that overcomes the above-mentioned problems, and in particular minimizes random background charge effects on device function.

SUMMARY

To address the above-discussed deficiencies of the prior art, the present invention provides a single-electron transistor device. The device comprises a source and drain located over a substrate and a quantum island situated between the source and drain, to form tunnel junctions between the source and the drain. The device further includes a fixed-gate electrode located adjacent the quantum island, the fixed-gate electrode having a capacitance associated therewith that varies as a function of an applied voltage to the fixed-gate electrode.

In another embodiment, the present invention provides a method of fabricating a single-electron device. The method includes forming a source and drain located over a substrate. The method also comprises placing a quantum island between the source and drain, wherein the quantum island forms tunnel junctions between the source and the drain. The method also includes forming the above-described fixed-gate electrode adjacent the quantum island.

Yet another embodiment of the present invention is a transistor circuit, comprising a single-electron device comprising a source, drain, quantum island and fixed-gate electrode as described above, and a metal-oxide semiconductor field-effect transistor (MOSFET) coupled to the single-electron device. The MOSFET is configured to amplify a drain current from the single-electron device.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The present invention recognizes the advantages of using single-electron devices that circumvent random background charge effects by using Coulomb oscillations to store and transmit logic states. The term Coulomb oscillations, as used herein refers to the periodic change in the drain current (Id) for increasing gate voltage ($V_G$) in a single-electron device. Unlike the Coulomb blockade, the Coulomb oscillation frequency is independent of random background charges.

The present invention further recognizes that the Coulomb oscillation frequency in a single-electron device can be modulated by changing a gate capacitance to the device. Moreover, a change in the logic state of the single-electron device can be accomplished by changing the gate's capacitance used to change the Coulomb oscillation frequency. Thus, single-electron devices that can store and transmit logic states by changing the Coulomb oscillation frequency are able to function substantially independently of random background charge effects.

As disclosed in U.S. patent application Ser. No. 10/448,673 (now U.S. Pat. No. 7,166,858), the gate's capacitance can be changed using a movable electrode. By contrast, in the present invention, a fixed-gate electrode is used. The term fixed-gate electrode as used herein refers to an electronic component with no moving parts and whose capacitance is configured to change as a function of an applied voltage. That is, the fixed-gate electrode has a capacitance associated therewith that varies as a function of a voltage applied to the fixed-gate electrode.

A fixed-gate electrode has several advantages over a moveable electrode. First, the ease of manufacturing the single-electron device is simplified because it is easier to build a fixed-gate electrode than a moveable electrode. Second, for a movable electrode, process flow variables are more limited than for a fixed-gate electrode. As an example, if one wishes to switch capacitance in the GHz range, then one has to make the moveable electrode small and light enough to ensure that mechanical frequencies are small enough to reach the GHz range. Such process considerations are not an issue when using fixed-gate electrodes. Third, movable electrodes can be less reliable than fixed-gate electrodes, because components that are moving often are more prone to fracture or breakage.

Figure 1A:
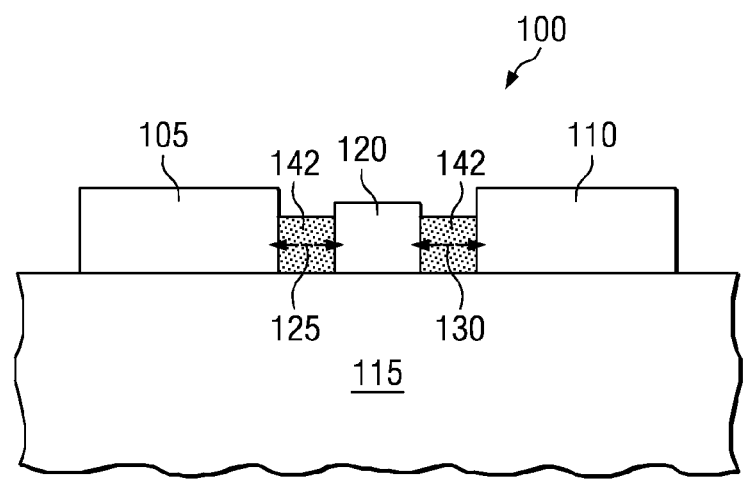
FIGS. 1A and 1B illustrate cross-sectional and top views of an exemplary single-electron transistor device of the present invention.
Figure 1B:
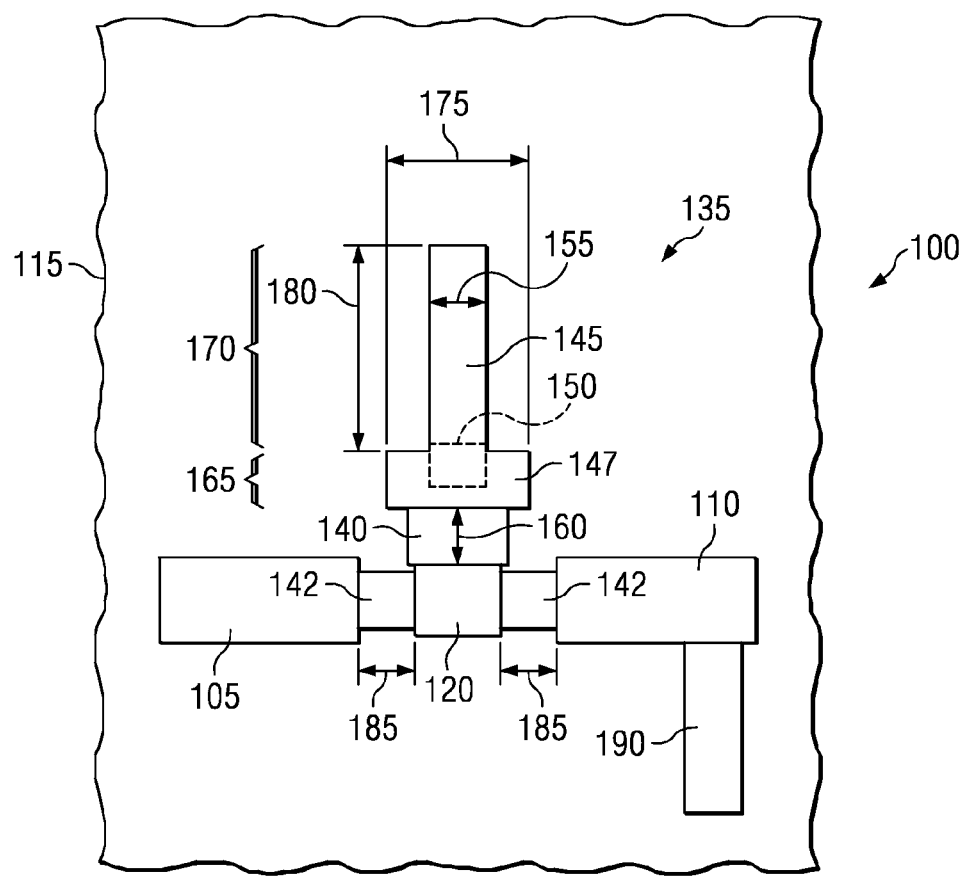

One embodiment of the present invention is shown in FIGS. 1A and 1B, which respectively illustrates cross-sectional and top views of an exemplary single-electron transistor device 100. Turning first to FIG. 1A, the single-electron transistor device 100 comprises a source and drain 105, 110 supported by a substrate 115. While it is shown that the source and drain 105, 110 are located on the substrate 115, other embodiments might provide the source and drain 105, 110 being located within the substrate 115. The substrate 115 can comprise any conventional semiconductor material, such as silicon. A quantum island 120 is located between the source and drain 105, 110 and forms tunnel junctions 125, 130 between the source and drain 105, 110.

As illustrated in FIG. 1B, the fixed-gate electrode 135 is located adjacent the quantum island 120. In a preferred embodiment, a dielectric material 140 is located between the fixed-gate electrode 135 and the quantum island 120. A second dielectric material 142 can also be located between the quantum island 120 and the source and drain 105, 110. The second dielectric material 142 can have the same or different composition as the dielectric material 140.

The term, quantum island 120, as used herein, refers to the structure between the source and drain 105, 110 that facilitates the movement of discrete electron tunneling from the source 105 to the island 120 and from the island 120 to drain 110. Those skilled in the art are familiar with discrete electron tunneling and with other terms used to refer to the quantum island 120, such as a quantum dot, a grain, a particle or a node.

With continuing reference to FIGS. 1A and 1B, for certain conditions and sizes of the quantum island 120, a voltage bias applied to the fixed-gate electrode 135 polarizes the tunnel junctions 125, 130. This, in turn, changes the Coulomb blockade energy, which is given by $e_2/2C_\Sigma$, where e is the electric charge on one electron, and $C_\Sigma$ is the total capacitance coupled to the quantum island 120. Preferably, the temperature is low enough, and the quantum island 120 is small enough, that the Coulomb blockade energy is large compared to the ambient thermal energy kT (i.e., $e_2/2C_\Sigma \gg kT$). Under such conditions, changing the Coulomb blockade energy facilitates tunneling of one or more discrete electrons as described above.

As noted above, the Coulomb oscillation frequency of the drain current can be modulated by changing the total capacitance coupled to the quantum island 120. One component of the total capacitance is the gate capacitance ($C_G$), the capacitance between the fixed-gate electrode 135 and the quantum island 120. The periodicity of the Coulomb oscillation is given by $e/C_G$. In the present invention, the fixed-gate electrode 135 is configured to change a variable capacitance ($C_{GV}$) between the quantum island 120 and the fixed-gate electrode 135 when a voltage ($V_G$) is applied to the fixed-gate electrode 135. As further discussed below, there can also be a constant capacitance ($C_{GC}$) between the quantum island 120 and the fixed-gate electrode 135. Changing $C_{GV}$ results in a change in the Coulomb oscillation frequency, which, in turn, can be use to encode logic states. That is, the gate capacitance ($C_G$), and hence logic states, can be changed by varying the capacitance of the fixed-gate electrode 135. In certain embodiments for instance, it is desirable to apply one of two $V_G$ values, corresponding to binary-encoded information, to the fixed-gate electrode 135. The change in $V_G$ preferably causes a large change in $C_G$. Preferred Coulomb oscillation frequencies can range from about 1 MHz to about 50 GHz.

There are numerous configurations available for the fixed-gate electrode 135. In some preferred embodiments, for instance, as shown in FIGS. 1A and 1B, the fixed-gate electrode 135 comprises a pn junction electrode. The pn junction electrode comprises silicon or polysilicon or other conventional materials having an n-doped region 145 and a p-doped region 146 with a depletion layer 150 there between. As well-known to those skilled in the art, a pn junction electrode comprises a capacitor. For the fixed-gate electrode 135 illustrated, the n-doped region 145 is one capacitor plate, the p-doped regions 147 is a second capacitor plate, and the depletion layer 150 in between these plates 145, 147 can store a charge. The capacitance between the n-doped regions 145 and p-doped regions 147 of the pn junction can be increased or decrease by applying a voltage to the fixed-gate electrode 135 to thereby change the width 155 of the depletion layer 150. For instance, in some cases, the capacitance can be decreased by applying a backward bias to the fixed-gate electrode 135 to thereby decrease the width 155 of the depletion layer 150. In other cases, the capacitance can be increased by applying a forward bias to thereby increase the width 155 of the depletion layer 150.

Figure 2:
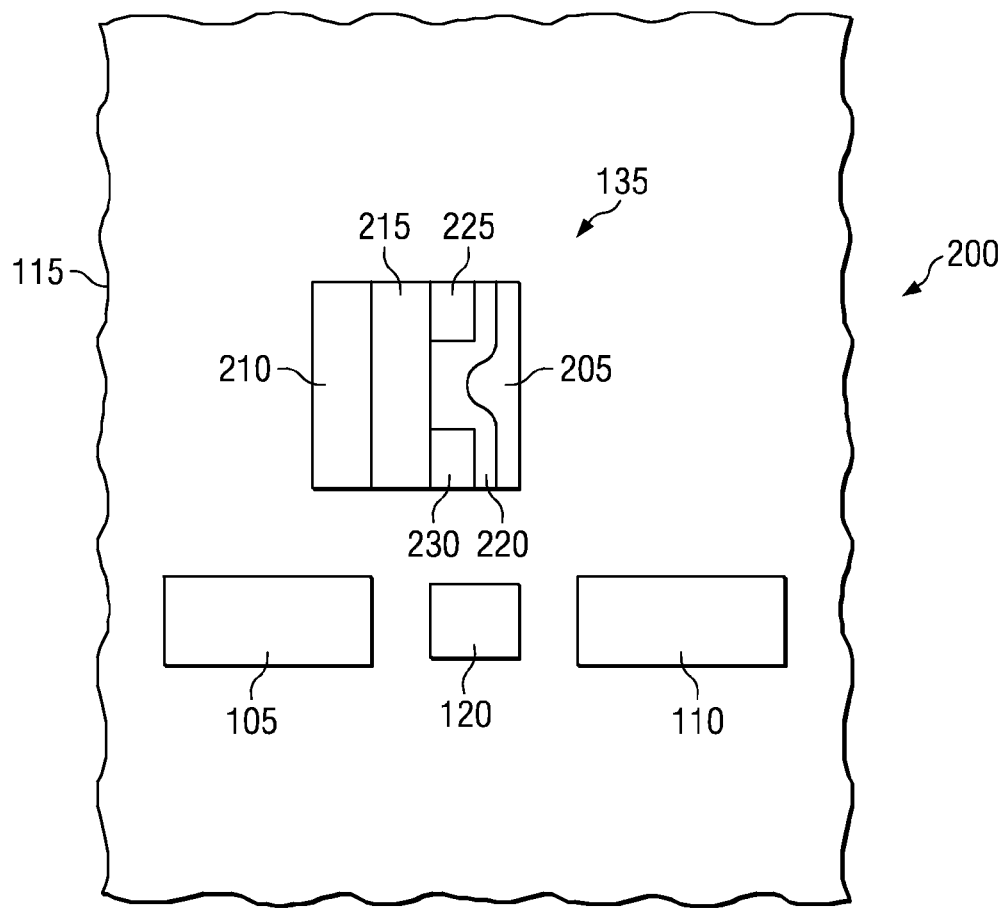
FIG. 2 illustrates a top view of an alternative single-electron transistor device of the present invention.

Another advantageous embodiment of the present invention is shown in FIG. 2, which illustrates a top view of an alternative single-electron transistor device 200. FIG. 2 uses the same reference numbers to depict analogous device components to that shown in FIGS. 1A and 1B. In the embodiment of the top view shown in FIG. 2, the fixed-gate electrode 135 comprises a depletion electrode, such as a metal oxide semiconductor capacitor (MOSCAP). In such embodiments, the fixed-gate electrode 135 comprises a first body 205 adjacent the quantum island 120 and a second body 210 adjacent the first body 205. The first and second bodies 205, 210 are separated by an insulator 215, the insulator comprising a dielectric material such as silicon oxide.

In some advantageous configurations, the first body 205 comprises a semiconductor material, such as silicon, or more preferably doped silicon. The second body 210 can comprise a metal such as titanium, doped polysilicon, a semiconductor material such as doped silicon or combinations thereof. The first body 205 further comprises a channel region 220 located adjacent the insulator 215 and, in some embodiments, is between source and drain electrodes 225, 230 that are also located in the body 205, thereby forming a MOSCAP. One of ordinary skill in the art would understand how the charge state of the channel region 220 can be depleted, accumulated or inverted as a function of the voltage $V_G$ applied to the second body 210, either alone or in combination with voltages applied to the source and drain electrodes 225, 230. One skilled in the art would also understand how switching the channel region 220 between these charge states causes a corresponding change in the capacitance of the fixed-gate electrode 135. Additionally, in embodiments where the second body 210 also comprises a semiconductor material, the fixed-gate electrode 135 can be operated in the opposite direction as described above. That is, a voltage applied to the first body 205 can result in the charge state of a channel region of the second body 210 being depleted, accumulated or inverted, with a corresponding change in the capacitance of the fixed-gate electrode 135.

Other configurations of the fixed-gate electrode 135 are also within the scope of the present invention, so long as the capacitance of the fixed-gate electrode 135 can be varied by applying a voltage $V_G$ to the electrode. Moreover, the fixed-gate electrode 135 can comprise one or more pn junction electrodes, one or more depletion electrodes or a combination of pn junction and depletion electrodes.

As mentioned above, in addition to the variable capacitive component $C_{GV}$, the fixed gate electrode 135 also has a constant capacitive component $C_{GC}$. Returning now to FIGS. 1A and 1B, the magnitude of $C_{GC}$ is a function of the distance 160 separating the quantum island 120 and the fixed gate electrode 135. This distance 160 can be advantageously adjusted to provide the desired change in $C_G$ and corresponding change in the Coulomb oscillation frequency of the device 100. In certain embodiments, for example, the distance 160 between the fixed-gate electrode 135 and the quantum island 120 is between about 1 nanometer and about 1000 nanometers, and more preferably between 10 and 100 nanometers.

The shape of the fixed-gate electrode 135 can also be altered to increase or decrease $C_{GV}$ and $C_{GC}$. For example, as illustrated in FIG. 1B, the fixed-gate electrode 135 can have a "T" shape, comprising a first body 165 and second body 170. As shown in FIG. 1B, the first and second bodies 165, 170 can be united, by virtue of being patterned from the same material, for example. In the embodiment depicted in FIG. 1B, the first body 165 has long dimension 175 adjacent to the quantum island 120, and the second body 170 has a long dimension 180 perpendicular to the long dimension 175 of the first body 165. In some cases, the first body 165 includes the p-doped region 145, n-doped region 147 and depletion zone 150. It would be apparent to one of ordinary skill in the art that changing the shape of other types of fixed-gated electrodes 135, such as a depletion gate electrode, would similarly alter $C_G$.

As noted above, the Coulomb oscillation frequency of the drain current of the single electron device, such as the devices 100, 200 presented in FIGS. 1A-1B and 2, respectively, can be modulated by changing $C_\Sigma$, of which $C_G$ is only one component. $C_\Sigma$ is also a function of the fixed capacitances between the source 105 and quantum island 120 ($C_S$) the drain 110 and quantum island 120 ($C_D$). Because these capacitances are in series, $C_\Sigma$ will be given by the sum of the reciprocals of $C_{GV}$, $C_{GC}$, $C_S$ and $C_D$, as well as any other capacitances associated with the quantum island 120. In certain embodiments, it is advantageous to adjust these capacitances so that $1/C_{GV}$ is approximately equal to the sum of reciprocals of the constant capacitances (e.g., $1/C_{GV} \sim (1/C_{GC}+1/C_S+1/C_D)$). In such embodiments, changing $C_{GV}$ can cause a substantial change in $C_\Sigma$ and hence in the Coulomb oscillation frequency of the drain current of the single electron device 100, 200.

Thus, with continuing reference to FIG. 1B, $C_\Sigma$ can be altered by changing the gap 185 between the source 105 and quantum island 120, the drain 110 and quantum island 120, with resultant changes in $C_S$ and $C_D$, respectively. Choosing the distance of the gap 185 is tempered, however, by the requirement to form tunnel junctions 125, 130. The size of gap 185 needed between the source and drain 105, 110 and the quantum island 120 to form tunnel junctions 125, 130 is well understood by those skilled in the art. For example, in some embodiments, the tunnel junctions 125, 130 are separated by a gap 185 of between about 1 nanometer and about 1000 nanometers.

$C_\Sigma$ also depends on the materials that the component parts of the single electron transistor 100 are made of. The source and drain, 105, 110 quantum island 120 and fixed-gate electrode 135, can be made of the same or different conventional materials. Such materials include, but are not limited to, silicon, GaAs heterostructures, metals, semiconductors, carbon nanotubes, or single molecules. In certain preferred embodiments, the source and drain 105, 110 and the quantum island 120 comprises doped polysilicon and the fixed-gate electrode 135 comprises doped silicon.

$C_\Sigma$ additionally depends on the choice of dielectric material 140 and the second dielectric material 142. In certain preferred embodiments, the dielectric materials 140, 142, are both gases, such as air. Alternatively, the dielectric materials 140, 142 can be other gases having a high dielectric constant, as well as a liquid or solid having a high dielectric constant (e.g., about the same or greater than the dielectric constant of air). In some preferred embodiments, one or both of the dielectric materials 140, 142, comprise silicon dioxide, formed by oxidizing a constriction in a silicon wire that also serves as the source and drain 105, 110 and quantum island 120. In other embodiments, one or both of the dielectric materials 140, 142, comprises aluminum oxide, which may be similarly formed by oxidizing a constriction in an aluminum wire that also serves as the source, drain and quantum island.

The single-electron transistor device 100 may have numerous designs. In some embodiments, it is advantageous for a number of the component parts of the single-electron transistor device to be in substantially the same plane, as illustrated in FIG. 1B. In certain preferred embodiments, for example, the source and drain 105, 110, quantum island 130 and fixed-gate electrode 135 are all located in substantially the same horizontal plane. Such configurations are desirable because fabrication is more easily accomplished using conventional processes, such as lithography, as further discussed below. In other embodiments, however, all or a portion of the fixed-gate electrode 135 can be located substantially out of the plane as the source and drain 105, 110 and the quantum island 120.

As further shown in FIG. 1B, the single-electron transistor device 100 may further include a filter 190 configured to allow a drain current having a predefined Coulomb oscillation frequency to pass through the filter 190. The filter 190 is preferably a high pass, low pass or band filter, or combination thereof. Additionally, the filter 190 can be configured to allow passage of the drain current having one Coulomb oscillation frequency, but not another Coulomb oscillation frequency. In such embodiment, for instance, a first logic state is defined when the drain current passes through the filter 190 while a second logic state is present when no drain current passes through the filter 190.

Another aspect of the present invention, a method for manufacturing a single-electron device. FIGS. 3 through 7 illustrate cross sectional, and in some cases, top views, of an exemplary method of fabricating a single-electron device 300 according to the principles of the present invention. One skilled in the art would understand that similar procedures could be used to form a variety of different single-electron devices within the scope of the present invention, such as the devices presented in FIGS. 1A-1B and 2.

Figure 3:
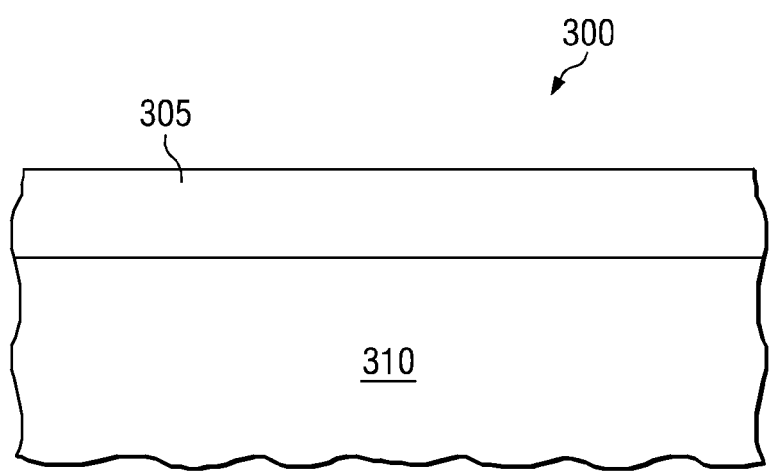
FIGS. 3 to 7 illustrate cross-sectional and top views of selected steps in an exemplary method for fabricating a single-electron device according to the principles of the present invention.

Turning first to the cross-sectional view shown in FIG. 3, the illustrated method includes forming a conductive layer 305 over a substrate 310. The fabrication of the components of the single-electron device 300 can include any number of conventional techniques, including lithographic processes. These processes can be used to deposit a resist material and pattern the conductive layer 305. Exposure of portions of the resist to radiation (e.g., ultraviolet or visible light, x-ray, ion beam, electron beam) followed by conventional etching procedures can be conducted to lithographically define a source 405, drain 410, and quantum island 415, as illustrated in the cross-sectional and top views shown in FIGS. 4 and 5, respectively. As further shown in FIGS. 4 and 5, lithographic processes can also be used to form a gate superstructure 420 of a fix-gate electrode 425. Of course, this or other device patterns can be replicated any number of times to produce a desired integrated circuit layout.

One skilled in the art would understand that in other embodiments of the method, placing the quantum island 415 could be accomplished using alternative conventional procedures. Such procedures include growing a conductive grain or particle using self-assembled growth procedures, such as molecular beam epitaxy or metal-organic chemical vapor deposition.

Figure 4:
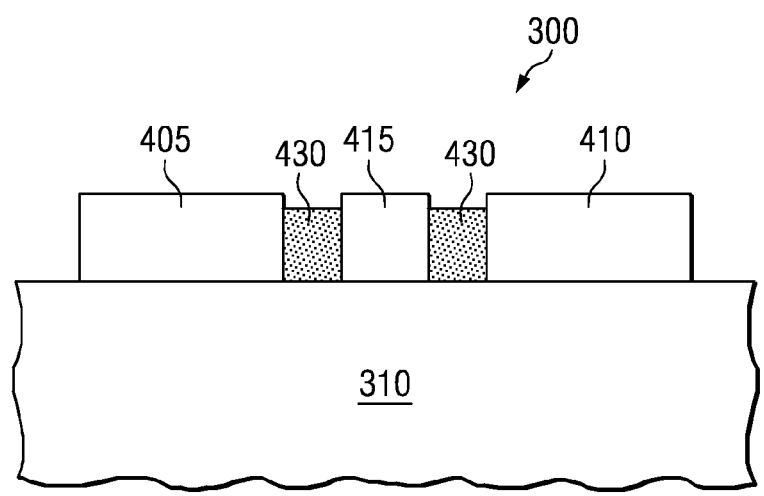
Figure 5:
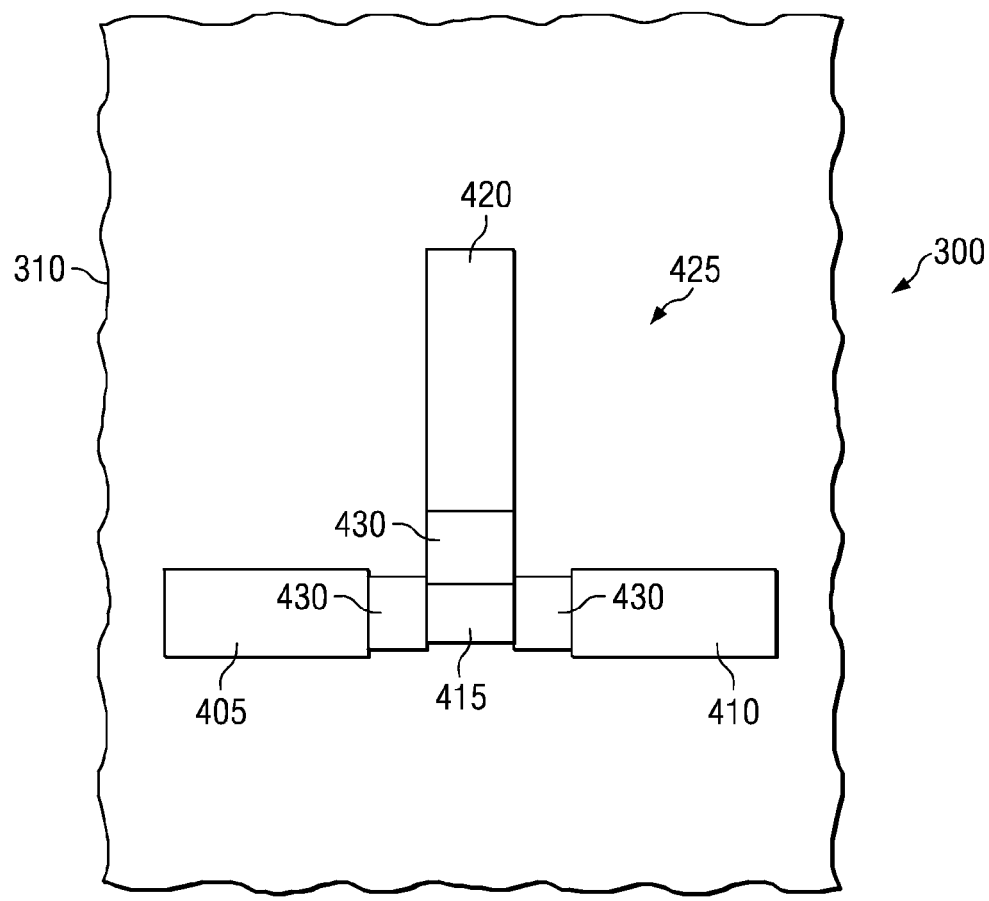

Other techniques of placing the quantum island 415 can include isolating particular regions of a silicon substrate and subjecting those isolated regions to an oxidizing process in such a way to isolate the quantum island 415 from the source and drain, 405, 410 or from the fixed-gate electrode 425. As illustrated in FIGS. 4 and 5, the oxidizing process also can advantageously form a dielectric material 430. Analogous to certain preferred embodiments of the dielectric materials 140, 142 shown in FIGS. 1A-B and 2, the dielectric material 430 can comprise silicon dioxide or aluminum oxide.

Figure 6:
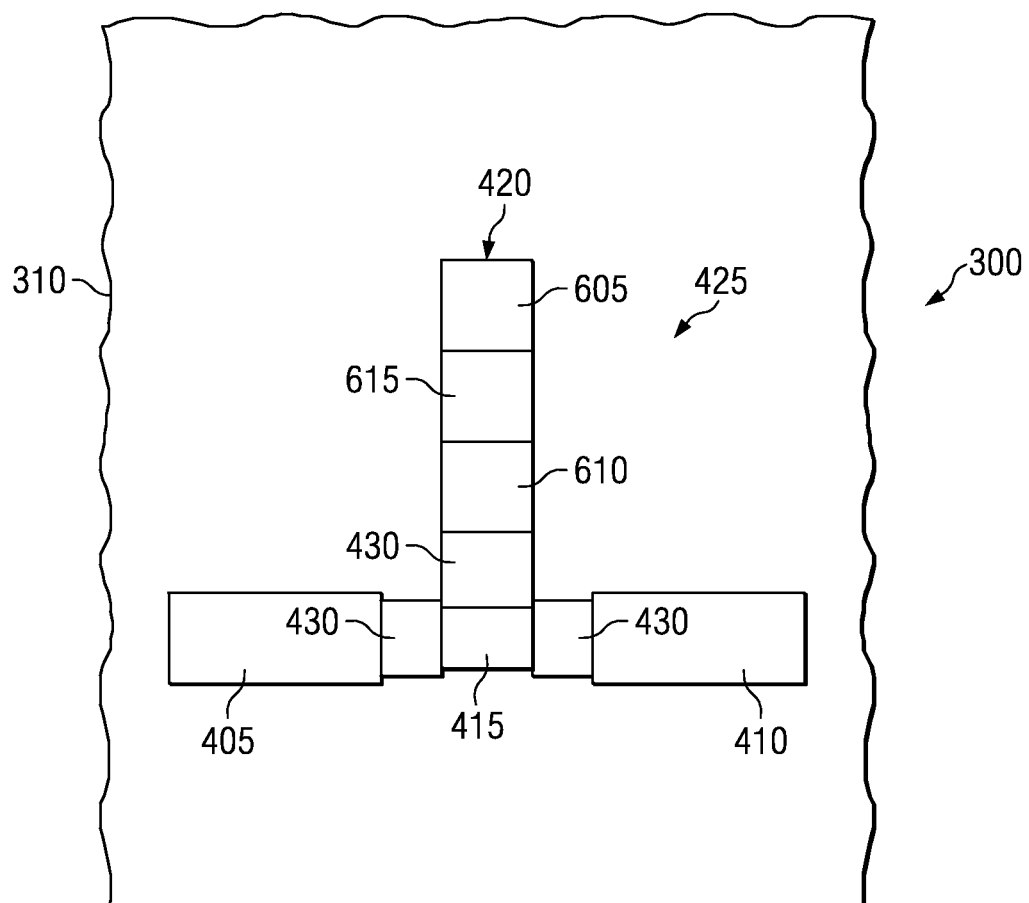

Turning now to FIG. 6, shown is a top view of the partially completed device 300, after doping different regions of the gate superstructure 420 of the fixed-gate electrode 425. Conventional lithographic masking and dopant implantation techniques well known to those skilled in art can be used to form n-type dopant regions 605 and p-type dopant regions 610, and thus define a depletion layer 615 there between, and thereby form a fix gate electrode 425 comprising a pn junction electrode.

Figure 7:
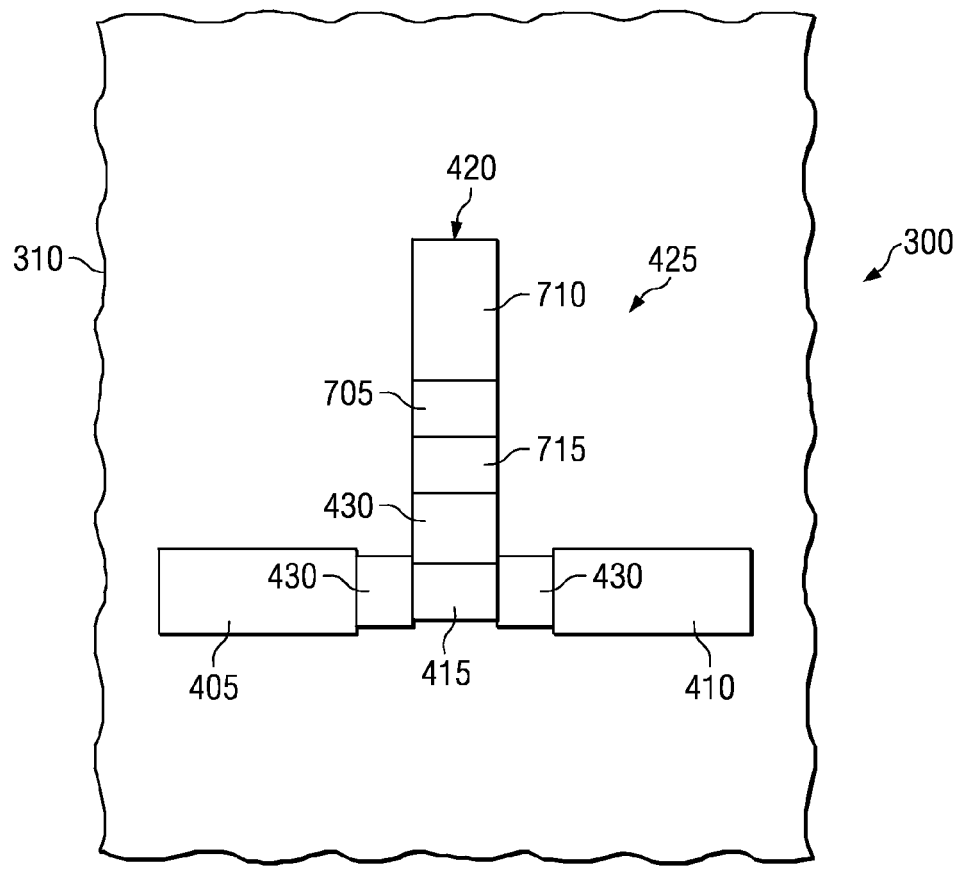

With continuing reference to FIGS. 3-5, in other embodiments of the method, lithographic procedures similar to that described above can be used to pattern the conductive layer 305 to form a fixed gate electrode 425 comprising a depletion electrode. As an example, the gate superstructure 420 shown in FIG. 5 can be isolated and subjected to an oxidizing process, similar to that described above for isolating the quantum island 415 from the source and drain 405, 410. FIG. 7 presents a top view of the device 300 after completion of the oxidation process, showing a dielectric material 705 that separates first and second bodies 710, 715 of the fixed-gate electrode 425.

Figure 8:
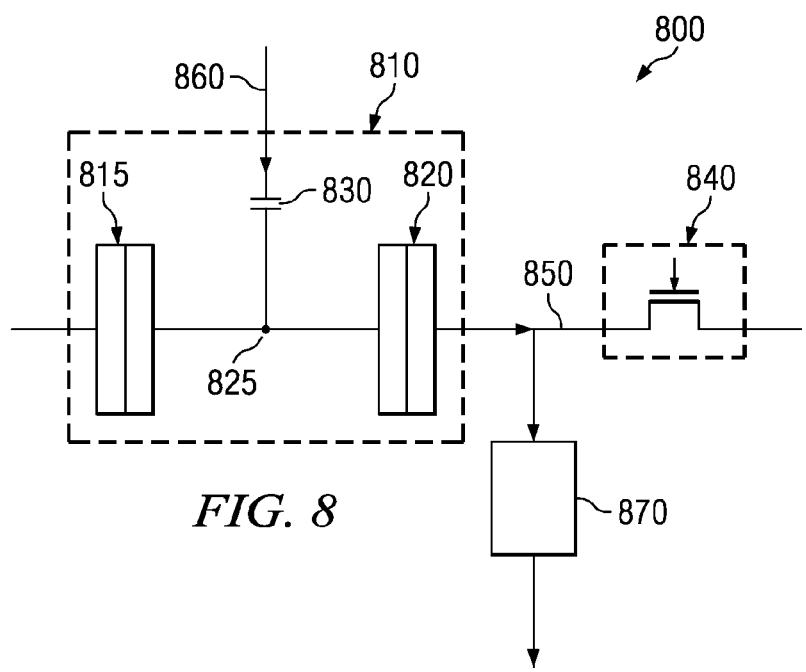
FIG. 8 presents a circuit diagram of an exemplary transistor circuit of the present invention.

Yet another embodiment of the present invention, a transistor circuit 800, is schematically illustrated in FIG. 8. The transistor circuit 800 comprises a single-electron device 810 of the present invention, including a source and drain 815, 820, quantum island 825 and fixed-gate electrode 830. The single-electron device 810 can comprise any of the previously discussed embodiments of the single-electron transistor devices and illustrated in FIGS. 1 through 7. The transistor circuit 800 further includes a conventional metal-oxide semiconductor field-effect transistor (MOSFET) 840 coupled to the single-electron device 810. The MOSFET 840 is configured to amplify a drain current 850 from the single-electron device 810.

One skilled in the art would understand that the transistor circuit 800 advantageously improves the voltage gain of the drain current 850 from the single-electron device 810 and thereby facilitate the use such circuits 800 in forming multiple logic levels. In certain preferred embodiments of the transistor 800, the fixed-gate electrode 830, is configured to change a capacitance between the quantum island 825 and the fixed-gate electrode 830 when a voltage 860 is applied to the fixed-gate electrode 830. In some advantageous embodiments of the transistor circuit 800, the voltage 860 applied to the fixed-gate electrode 830 is configured to contain binary information. In still other preferred embodiments, for example, when the voltage 860 has a first amplitude, the drain current 850 will have a first Coulomb oscillation frequency between about 0.1 and about 1.0 GHz, which, in turn, corresponds to a first logic state. When the voltage 860 has a second amplitude, the drain current 850 has a second Coulomb oscillation frequency between about causes said drain current to have a second Coulomb oscillation frequency of said drain current that is at least between about 2 to 3 times greater than the first Coulomb oscillation frequency, and which corresponds to a second logic state.

Certain preferred embodiments of the transistor circuit 800, further include a filter 870 coupled to the single-electron device 810 and the MOSFET 840. As discussed previously, the filter 870 can be advantageously configured to allow the drain current 850 to pass through the filter when the drain current 850 has a predefined Coulomb oscillation frequency, and thereby facilitate the defining logic states in the circuit 800.

Although the present invention has been described in detail, one of ordinary skill in the art should understand that they can make various changes, substitutions and alterations herein without departing from the scope of the invention.

What is claimed is:
1. A single-electron transistor device, comprising:
a source and drain supported by a substrate;
a quantum island located between said source and drain and that forms tunnel junctions between said source and said drain; and a fixed-gate electrode located adjacent said quantum island, said fixed-gate electrode having a capacitance associated therewith that varies as a function of an applied voltage.

2. The single-electron transistor device as recited in claim 1, wherein said fixed-gate electrode is configured to change a capacitance between said quantum island and said fixed-gate electrode when said voltage is applied to said fixed-gate electrode.

3. The single-electron transistor device as recited in claim 1, wherein said fixed-gate electrode comprises a depletion electrode.

4. The single-electron transistor device as recited in claim 1, wherein said fixed-gate electrode comprises a pn junction electrode.

5. The single-electron transistor device as recited in claim 4, wherein said pn junction electrode comprises silicon or polysilicon having n-doped regions and p-doped regions.

6. The single-electron transistor device as recited in claim 4, wherein said pn junction electrode has a first body adjacent said quantum island and a second body united with said first body, a long dimension of said second body being perpendicular to a long dimension of said first body.

* * * * *